United States Patent
Chou et al.

(10) Patent No.: US 8,129,235 B2
(45) Date of Patent: Mar. 6, 2012

(54) METHOD OF FABRICATING TWO-STEP SELF-ALIGNED CONTACT

(75) Inventors: Ling-Chun Chou, Yunlin County (TW); Ming-Tsung Chen, Hsinchu County (TW); Po-Chao Tsao, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 281 days.

(21) Appl. No.: 11/686,740

(22) Filed: Mar. 15, 2007

(65) Prior Publication Data

US 2008/0230917 A1    Sep. 25, 2008

(51) Int. Cl.
*H01L 21/8238* (2006.01)

(52) U.S. Cl. .......... 438/221; 438/229; 438/299

(58) Field of Classification Search .......... 257/693, 257/E21.575, E21.585, 760; 438/618, 622, 438/221, 229, 637, 634, 790, 760, 299
See application file for complete search history.

(56) References Cited

U.S. PATENT DOCUMENTS

| | | | |
|---|---|---|---|
| 4,996,167 A * | 2/1991 | Chen | 438/279 |
| 6,165,880 A * | 12/2000 | Yaung et al. | 438/592 |
| 6,258,678 B1 | 7/2001 | Liaw | |
| 6,441,418 B1 | 8/2002 | Shields et al. | |
| 6,791,190 B1 | 9/2004 | Chung | |
| 7,170,174 B2 | 1/2007 | Huglin et al. | 257/758 |
| 7,303,955 B2 * | 12/2007 | Kim | 438/257 |
| 2005/0136649 A1 * | 6/2005 | Lee et al. | 438/637 |

FOREIGN PATENT DOCUMENTS

| | | |
|---|---|---|
| DE | 103 10 346 | 9/2004 |
| GB | 2 387 027 | 10/2003 |

OTHER PUBLICATIONS

Chinese Second Examination Report of China Application No. 2007100916107, dated on Feb. 12, 2007.
Chinese Examination Report of Taiwan Application No. 096110074, dated Aug. 2, 2010.

* cited by examiner

*Primary Examiner* — Andy Huynh
*Assistant Examiner* — Kimberly M Thomas
(74) *Attorney, Agent, or Firm* — J.C. Patents

(57) ABSTRACT

A method of fabricating a self-aligned contact is provided. A first dielectric layer is formed on a substrate having a contact region therein. Next, a lower hole corresponding to the contact region is formed in the first dielectric layer. Thereafter, a second dielectric layer is formed on the first dielectric layer, and then an upper hole self-aligned to and communicated with the lower hole is formed in the second dielectric layer, wherein the upper hole and the lower hole constitute a self-aligned contact hole. Afterwards, the self-aligned contact hole is filled with a conductive layer.

15 Claims, 8 Drawing Sheets

METHOD OF FABRICATING TWO-STEP SELF-ALIGNED CONTACT

BACKGROUND OF THE INVENTION

1. Field of the Invention

The present invention relates to an integrated circuit device and a method of fabricating the same, and more particularly to a self-aligned contact (SAC) and a two-step method of fabricating the same.

2. Description of Related Art

Along with the progress of science and technology, the integration of electronic devices must be improved to meet the trend of light, thin, short, and small electronic devices. In addition to reducing the size of the semiconductor devices, the method of improving the integration can also be achieved by reducing the distance between semiconductor devices. However, some process problems are unavoidable no matter the size of the semiconductor devices or the distance between the semiconductor devices is reduced.

As for a self-aligned contact process, after the contact is downsized, the aspect ratio of the contact is increased, such that the etching becomes difficult and the process window becomes small. In order to remove the residual in the etching process and keep contact hole open, a long time over-etching is usually performed to avoid that the contact hole cannot be fully opened. However, referring to FIG. 1, during a lithography process, misalignment often occurs, and a bowling effect often occurs when etching a dielectric layer 16 to form a contact hole 14. Therefore, if the over-etching takes a long time, a top corner 10 of a gate 12 may be exposed easily, resulting in a gate poly short problem, as shown in region A. In another aspect, as the aspect ratio of the contact hole increases, the filling of the metal layer in the contact hole becomes increasingly difficult.

US Patent Application NO. 2005/0136649 has disclosed a method of fabricating a self-aligned contact. First, a stacked film layer of a plurality of layers of different materials on a substrate. Then, an inner insulating layer is formed. Thereafter, a single-stage self-aligned contact etching process is performed in a source/drain region by utilizing different etching rates of individual film layers. During the process of removing the inner insulating layer and a portion of the stacked film layer, one film layer in the stack layer is used as an etch stop layer to form a contact hole with a T-shaped section, so as to expose the film layer used as the etch stop layer in the stacked film layer.

U.S. Pat. No. 6,791,190 has disclosed a method of fabricating a self-aligned contact. First, a conformal liner layer is formed on a substrate. An inner dielectric layer is formed. The inner dielectric layer is patterned with the conformal liner layer as an etch stop layer to form a self-aligned contact hole/borderless contact hole. The method also uses a single-stage self-aligned contact etching process to form the contact hole/borderless contact hole.

In another aspect, in a common semiconductor process, in order to increase the mobility of electrons or holes in channels of MOS transistor, a stress layer is usually formed on the substrate after fabricating the metal oxide semiconductor (MOS) transistor. As for a PMOS transistor, a stress layer having compressive stress is formed on the substrate, and generates a compressive stress along the channel direction in the PMOS transistor. As for an NMOS transistor, a stress layer having tensile stress is formed on the substrate, and generates a tensile stress along the channel direction in the NMOS transistor. Along with the increase of the compressive stress or tensile stress, the mobility of electrons or holes in the channel increases, thereby increasing the drive current to improve device performance.

Since the stress layer is very thick, the above problems and the problem of application area limiting on the source/drain region with larger area and lower accuracy still exist when performing etching process of the self-aligned contact with the above single step conventional methods.

SUMMARY OF THE INVENTION

The present invention is directed to providing an etching process of a self-aligned contact, so as to avoid the problem that the contact hole cannot be fully opened.

The present invention is also directed to providing an etching process of a self-aligned contact, which can improve an aligned accuracy window between the contact and a gate, and eliminate the short circuit caused by misalignment, over-etching, and bowing effect.

The present invention is further directed to providing a self-aligned contact process, in which a contact hole can be easily be filled with a conductive layer.

The present invention is yet directed to providing a self-aligned contact process to reduce the difficulty in etching, increase the process window, and improve the throughput.

The present invention is still directed to providing a self-aligned contact process, in which a stress layer can be integrated.

The present invention provides a method of fabricating a self-aligned contact. A first dielectric layer is formed on a substrate having a contact region thereon. Next, a lower hole corresponding to the contact region is formed in the first dielectric layer. Thereafter, a second dielectric layer is formed on the first dielectric layer, and then an upper hole self-aligned to and communicated with the lower hole is formed in the second dielectric layer, wherein the upper hole and the lower hole constitute a self-aligned contact hole. Afterwards, the self-aligned contact hole is filled with a conductive layer.

In the method of fabricating a self-aligned contact according to an embodiment of the present invention, in the step of forming the lower hole in the first dielectric layer, the formed lower hole exposes a portion of the first dielectric layer on the contact region, and in the step of forming the upper hole, the first dielectric layer at the bottom of the lower hole is further removed to expose the contact region.

In the method of fabricating a self-aligned contact according to an embodiment of the present invention, the first dielectric layer comprises a stress layer. The material of the stress layer comprises silicon nitride. In the step of forming the lower hole in the first dielectric layer, the stress layer is timed-etched, such that a portion of the stress layer is still overlaid on the contact region at the bottom of the formed lower hole.

In the method of fabricating a self-aligned contact according to an embodiment of the present invention, the first dielectric layer comprises an etch stop layer, an endpoint detection layer, and a stress layer from bottom to top. The material of the etch stop layer comprises silicon nitride, the material of the endpoint detection layer comprises silicon oxide, and the material of the stress layer comprises silicon nitride. In the step of forming the lower hole in the first dielectric layer, the lower hole exposes the stress layer, the endpoint detection layer, or the etch stop layer.

In the method of fabricating a self-aligned contact according to an embodiment of the present invention, the first dielectric layer comprises an endpoint detection layer and a stress layer from bottom to top. The material of the endpoint detection layer comprises silicon oxide, and the material of the stress layer comprises silicon nitride. In the step of forming the lower hole in the first dielectric layer, the lower hole exposes the stress layer or the endpoint detection layer.

The method of fabricating a self-aligned contact according to an embodiment of the present invention further comprises forming a liner layer on the sidewall of the lower hole after forming the lower hole and before forming the second dielectric layer. The material of the liner layer comprises silicon oxide or silicon oxynitride.

In the method of fabricating a self-aligned contact according to an embodiment of the present invention, the material of the second dielectric layer is selected from a group consisting of silicon oxide deposited by atmospheric pressure chemical vapor deposition (CVD), silicon oxide deposited by high density plasma vapor deposition, phosphosilicate glass, borophosphosilicate glass, fluorine-doped silican glass, and a combination thereof.

In the method of fabricating a self-aligned contact according to an embodiment of the present invention, the self-aligned contact is a contact of a source/drain region, a contact of a gate, or a contact shared by a source/drain region and a gate.

In the method of fabricating a self-aligned contact according to an embodiment of the present invention, the size of the lower hole is different from the size of the upper hole.

In the method of fabricating a self-aligned contact according to an embodiment of the present invention, the size of the lower hole is smaller than the size of the upper hole.

The present invention provides a self-aligned contact, which comprises a lower contact and an upper contact disposed in a dielectric layer of a substrate, wherein the upper contact is disposed on the lower contact and directly connected to the lower contact, and the size of the upper contact is different from the size of the lower contact.

In the self-aligned contact according to an embodiment of the present invention, the size of the upper contact is larger than the size of the lower contact.

In the self-aligned contact according to an embodiment of the present invention, the self-aligned contact is a contact connected to a source/drain region, a contact connected to a gate, or a contact shared by a source/drain region and a gate.

The self-aligned contact according to an embodiment of the present invention further comprises a liner layer disposed between the periphery of the lower contact and the dielectric layer.

In the self-aligned contact according to an embodiment of the present invention, the material of the liner layer comprises silicon oxide or silicon oxynitride.

In the self-aligned contact according to an embodiment of the present invention, the first dielectric layer comprises a stress layer. The material of the stress layer comprises silicon nitride.

In the self-aligned contact according to an embodiment of the present invention, the first dielectric layer comprises an etch stop layer, an endpoint detection layer, and a stress layer from bottom to top. The material of the etch stop layer comprises silicon nitride, the material of the endpoint detection layer comprises silicon oxide, and the material of the stress layer comprises silicon nitride.

In the self-aligned contact according to an embodiment of the present invention, the first dielectric layer comprises an endpoint detection layer and a stress layer from bottom to top. The material of the endpoint detection layer comprises silicon oxide, and the material of the stress layer comprises silicon nitride.

The self-aligned contact process of the present invention can improve the aligned accuracy window between the contact and a gate, and eliminate the short circuit caused by misalignment, over-etching, and bowing effect.

In addition, the present invention adopts a multi-staged etching, which can reduce the difficulty in etching, and avoid that the contact hole cannot be fully opened. Therefore, the present invention may improve the process window and improve the throughput.

Moreover, as the size of the upper hole is larger than the size of the lower hole of the contact, the conductive layer can be easily filled in the contact hole.

Furthermore, a linear layer is formed in the lower hole, such that a smaller hole can be fabricated with the current lithography level.

In another aspect, the widely used stress layer can be integrated in the present invention.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

FIGS. 2A-2F are sectional views of the processes of a method of fabricating a semiconductor device according to an embodiment of the present invention.

Figure 1:
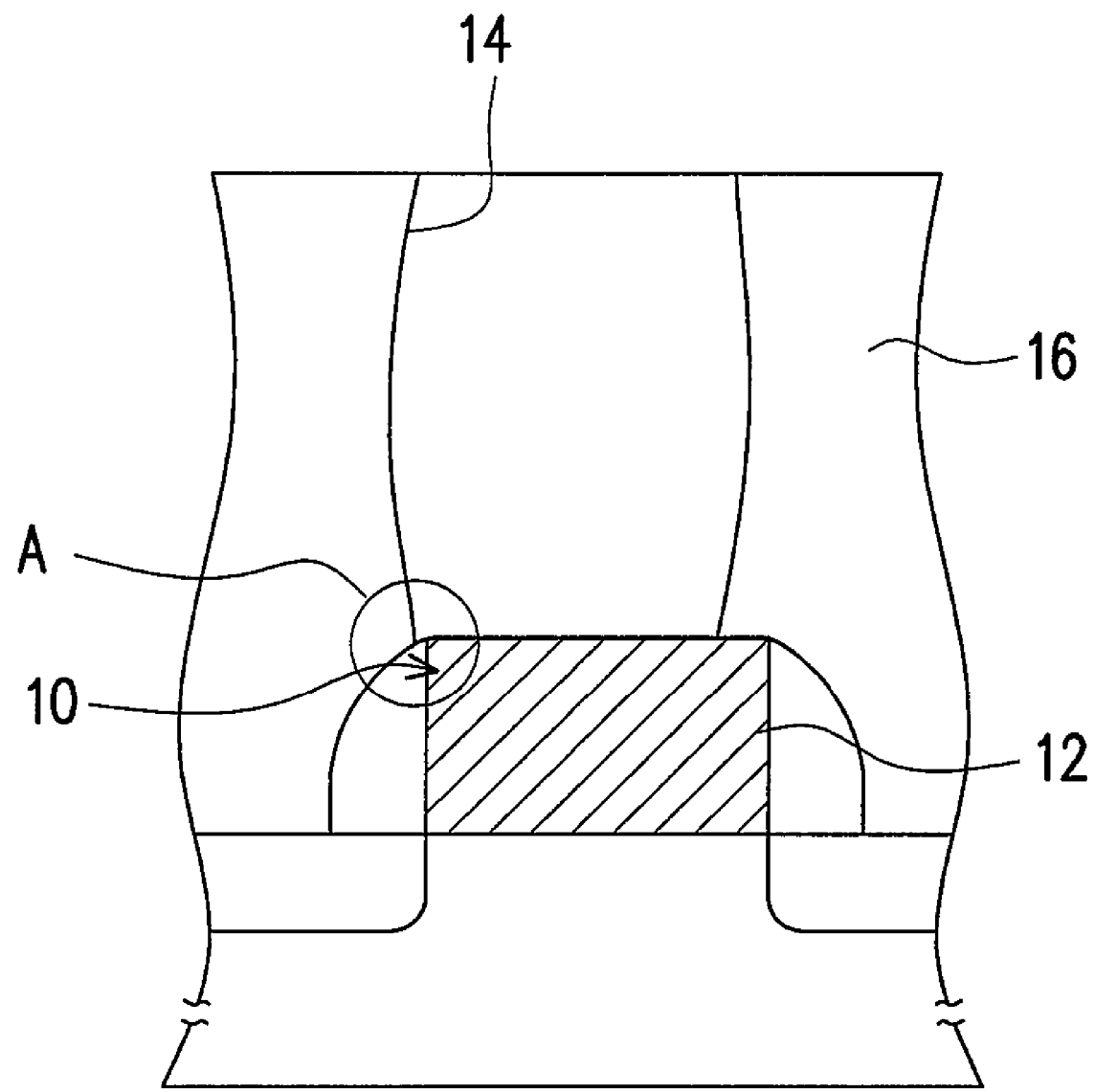
FIG. 1 is a schematic view of a conventional contact.
Figure 2A:
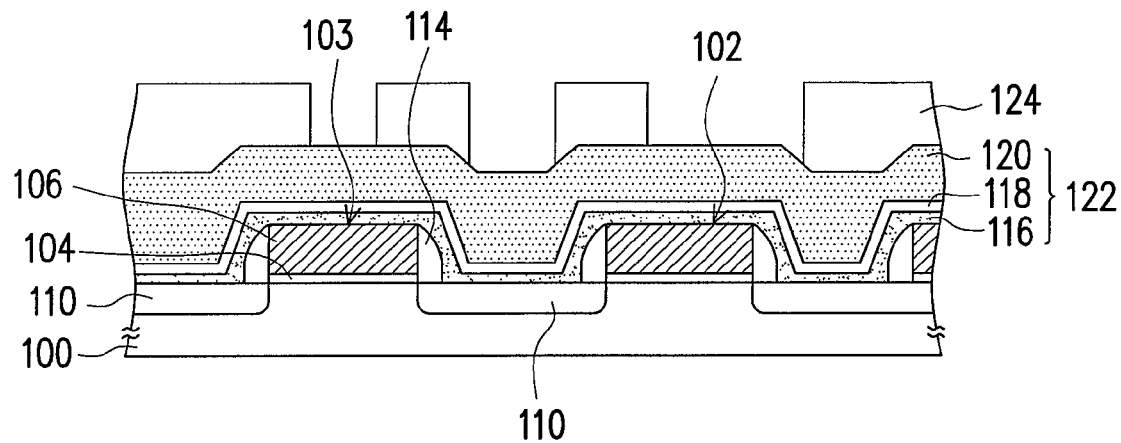
FIGS. 2A-2F are sectional views of the processes of a method of fabricating a semiconductor device according to an embodiment of the present invention.

Referring to FIG. 2A, a substrate 100 is provided first. The substrate 100 is, for example, a silicon substrate, such as an n-type silicon substrate or a p-type silicon substrate. Definitely, the substrate 100 can also be a silicon-on-insulator (SOI) substrate. Transistors 102 and 103 are already formed on the substrate 100, which are for example, n-channel metal-oxide-semiconductors (NMOS) or p-channel metal-oxide-semiconductors (PMOS).

The transistors 102 and 103 respectively include a gate dielectric layer 104, a gate 106, a spacer 114, and a source/drain 110. The gate dielectric layer 104 is disposed between the gate 106 and the substrate 100. The material of the gate dielectric layer 104 is constituted of silicon oxide layer. The material of the gate 106 includes a silicon-based material, for example, one selected from among doped silicon, undoped silicon, doped polysilicon, or undoped polysilicon. If the material of the gate 106 is doped silicon or doped polysilicon, the dopant in the silicon or polysilicon is an n-type dopant or a p-type dopant. The spacer 114 can include a single spacer or two spacers. In this embodiment, the spacer 114 is illustrated with a single spacer. The material of the spacer 114 is, for example, silicon oxide or silicon nitride. Moreover, the shape of the spacer 114 is not particularly limited.

The source/drain region 110 is disposed in the substrate 100 at both sides of the gate 106. The dopant of the source/drain region 110 is an n-type dopant or a p-type dopant. The material of the source/drain region 110 is, for example, semiconductor material or the material mainly containing semiconductor compound. The semiconductor material is, for example, silicon. The material of semiconductor compound is, for example, SiGe or SiC.

In an embodiment, metal silicide layers (not shown) are respectively disposed on the surface of the gate 106 and on the source/drain region 110. The metal silicide layers include metal silicide layers of refractory metal, for example, one selected from among the silicides of Ni, Co, Ti, Cu, Mo, Ta, W, Er, Zr, Pt, and an alloy thereof.

Referring to FIG. 2A, a dielectric layer 122 is formed on the substrate 100. In an embodiment, the dielectric layer 122 is constituted by, for example, a stress layer 120, and the stress layer 120 can increase drive current and improve device performance. As for a PMOS transistor, the stress layer 120 is a compressive stress layer, which generates a compressive stress along the channel direction in the PMOS transistor to increase the mobility of the holes in the channels. As for an NMOS transistor, the stress layer 120 is a tensile stress layer, which generates a tensile stress along the channel direction in the NMOS transistor to increase the mobility of the electrons in the channels. The material of the stress layer 120 is, for example, silicon nitride, and the method of forming the same is, for example, chemical vapor deposition.

In another embodiment, in addition to the stress layer 120, the dielectric layer 122 further includes an endpoint detection layer 118 disposed under the stress layer 120. The material of the endpoint detection layer 118 is different from the material of the stress layer 120, and the endpoint detection layer 118 has an etching rate different from that of the stress layer 120 during the etching process. The material of the endpoint detection layer 118 is, for example, silicon oxide, and the method of forming the same is, for example, chemical vapor deposition.

In yet another embodiment, in addition to the stress layer 120 and the endpoint detection layer 118, the dielectric layer 122 further includes an etch stop layer 116 disposed under the endpoint detection layer 118. The material of the etch stop layer 116 is different from the material of the endpoint detection layer 118, and the etch stop layer 116 has an etching rate different from that of the endpoint detection layer 118 during the etching process. The material of the etch stop layer 116 is, for example, silicon nitride, and the method of forming the same is, for example, chemical vapor deposition.

Still referring to FIG. 2A, a patterned photoresist layer 124 is formed on the dielectric layer 122.

Figure 2B:
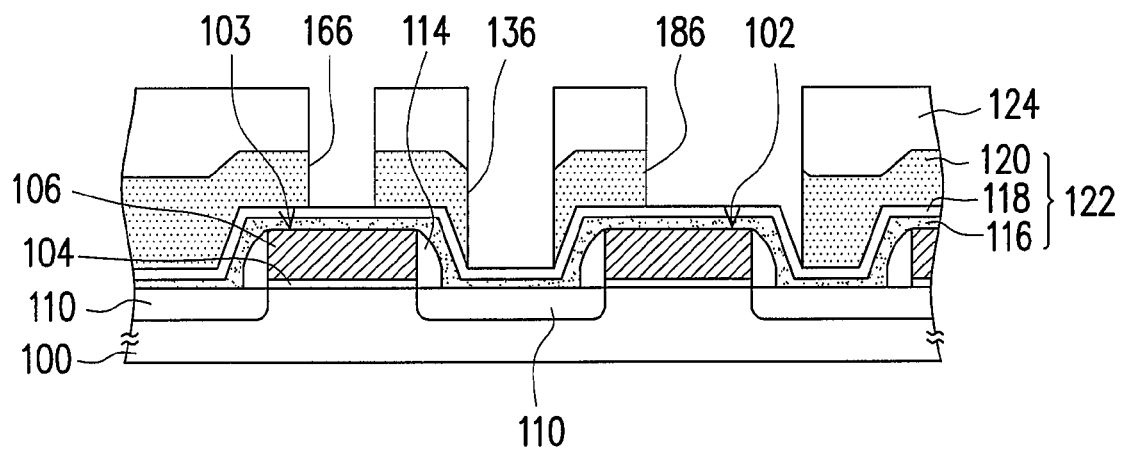

Referring to FIG. 2B, a first stage of patterning process is performed on the dielectric layer. The dielectric layer 122 is etched with the patterned photoresist layer 124 as an etching mask, so as to form lower holes 136, 166, 186 in the dielectric layer 122, which are corresponding to the predetermined contact regions covered by a portion of the dielectric layer 122, i.e., corresponding to but not exposing the source/drain region 110, the gate 106 of the transistor 103, and the gate 106 of the transistor 102. The dielectric layer 122 exposed by the lower holes 136, 166, 186 and covering the source/drain region 110, the gate 106 of the transistor 103, and the gate 106 of the transistor 102 can be used as the protection layer during the subsequent etching process, so as to avoid the damage caused by etching.

When the dielectric layer 122 includes the stress layer 120, after the etching process, the stress layer 120 is still left on the source/drain region 110, the gate 106 of the transistor 103 and the gate 106 of the transistor 102 at the bottom of the formed lower holes 136, 166, and 186.

When the dielectric layer 122 includes the stress layer 120 and the endpoint detection layer 118, the endpoint detection layer 118 can be used as an etch stop layer in the etching process, such that the bottoms of the formed lower holes 136, 166, and 186 expose the endpoint detection layer 118. Or, the etching process can be timed-controlled to stop at the stress layer 120, such that the stress layer 120 is still left on the source/drain region 110, the gate 106 of the transistor 103, and the gate 106 of the transistor 102 at the bottom of the formed lower holes 136, 166, and 186.

When the dielectric layer 122 includes the stress layer 120, the endpoint detection layer 118, and the etch stop layer 116, the etching process is the same as that described above, such that the bottoms of the formed lower holes 136, 166, and 186 expose the endpoint detection layer 118, the stress layer 120, or the etch stop layer 116.

The method of etching the dielectric layer 122 is an anisotropic etching process, for example, dry etching process with fluorocarbon or various known gases as the etching gas source.

Figure 2C:
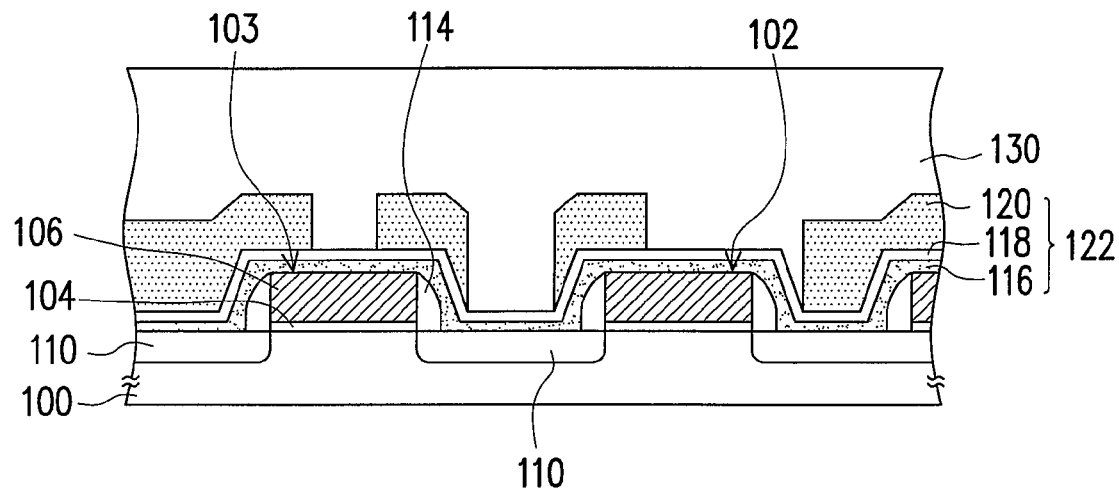

Referring to FIG. 2C, the patterned photoresist layer 124 is removed. The method of removing the patterned photoresist layer 124 is, for example, wet removing or dry removing such as oxygen plasma ashing. Then, another dielectric layer 130 is formed on the substrate 100. The dielectric layer 130 includes, for example, a single layer or more than two material layers. In this embodiment, a single layer of dielectric layer 130 is taken as an example for illustration. The material of the dielectric layer 130 is, for example, silicon oxide deposited by atmospheric pressure chemical vapor deposition (CVD), silicon oxide deposited by high density plasma vapor deposition, phosphosilicate glass, borophosphosilicate glass, fluorine-doped silican glass, or the like.

Figure 2D:
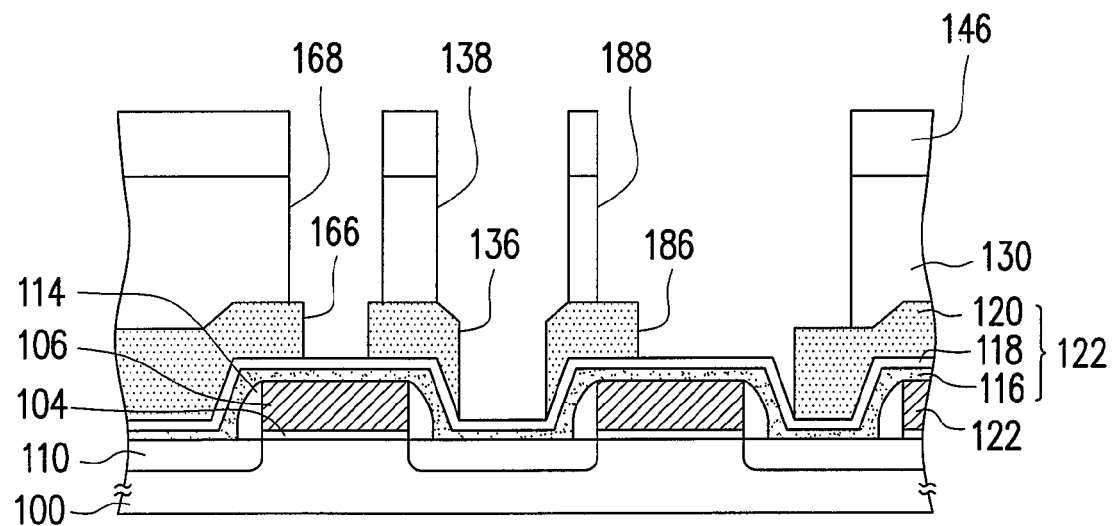

Referring to FIG. 2D, a second stage of patterning process of the dielectric layer is performed. A patterned photoresist layer 146 is formed on the dielectric layer 130. The dielectric layer 130 is etched with the patterned photoresist layer 146 as an etching mask and the residual dielectric layer 122 as an etch stop layer, so as to form the upper holes 138, 168, and 188 in the dielectric layer 130. The upper hole 138 is self-aligned to and communicated with the lower hole 136, the upper hole 168 is self-aligned to and communicated with the lower hole 166, and the upper hole 188 is self-aligned to and communicated with the lower hole 168. In the etching process of forming the upper holes 138, 168, and 188, the stress layer 120, the endpoint detection layer 118, or the etch stop layer 116 of the dielectric layer 122 can be used as the stop layer to protect the source/drain region 110 and the gate 106 thereebeneath from being damaged by etching. The method of etching the dielectric layer 130 is an anisotropic etching process, for example, dry etching process with fluorocarbon or various known gases as the etching gas source.

Figure 2E:
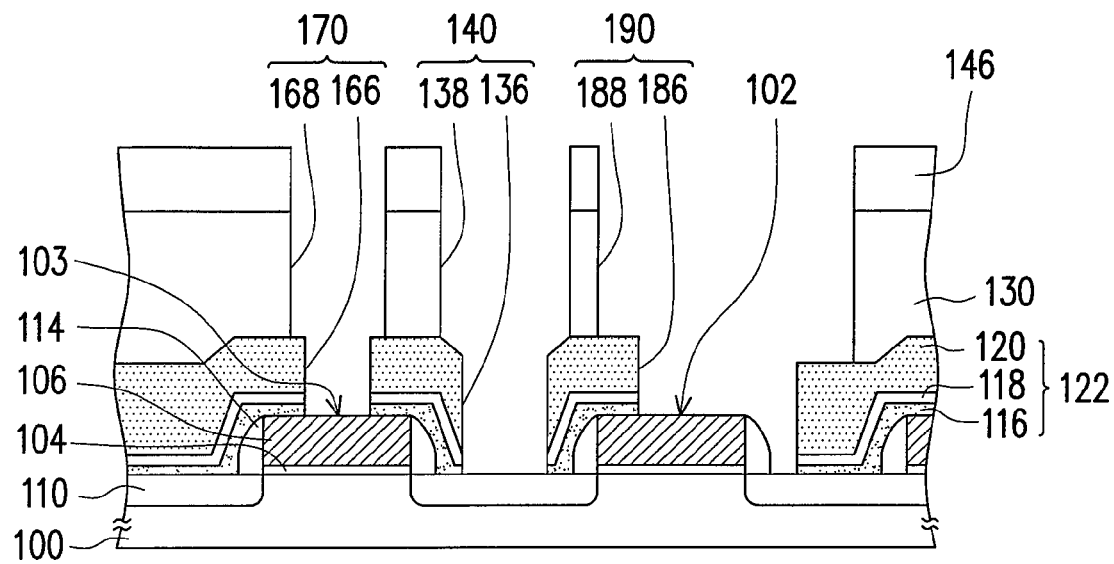

Referring to FIG. 2E, the dielectric layer 122 at the bottom of the lower holes 136, 166, 186 is removed, so as to expose the source/drain region 110, the gate 106 of the transistor 103, and the gate 106 and the source/drain region 110 of the transistor 102, thus forming a self-aligned contact hole 140 constituted by the upper hole 138 and the lower hole 136, a self-aligned contact hole 170 constituted by the upper hole 168 and the lower hole 166, and a self-aligned shared contact hole 190 constituted by the upper hole 188 and the lower hole 186. The method of removing the dielectric layer 122 at the bottom of the lower holes 136, 166, 186 is an anisotropic etching process, for example, dry etching process with fluorocarbon or various known gases as the etching gas source.

Then, the patterned photoresist layer 146 is removed. The method of removing the patterned photoresist layer 146 is, for example, wet removing, or dry removing such as oxygen plasma ashing.

Figure 2F:
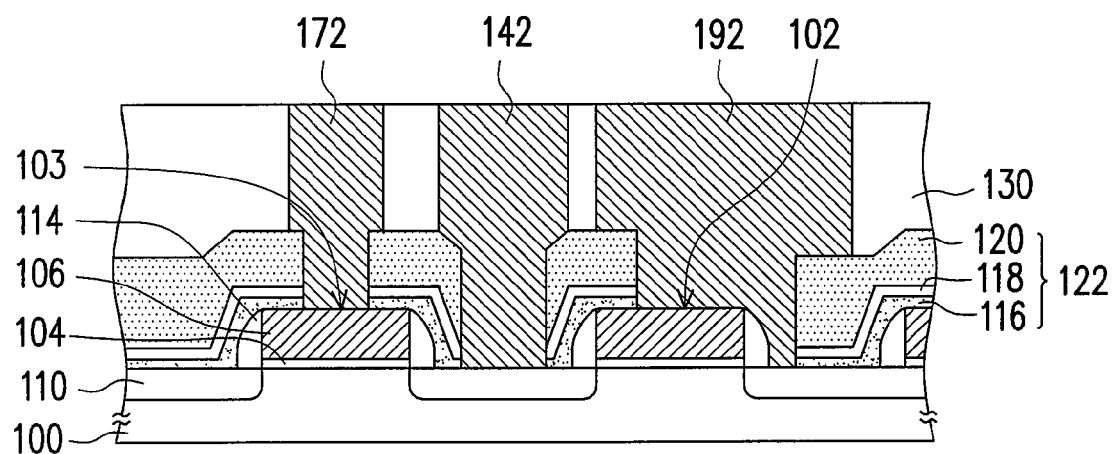

Referring to FIG. 2F, the self-aligned contact holes 140, 170 and the shared self-aligned contact hole 190 are filled with a conductive layer, so as to form self-aligned contacts 142, 172 and a shared self-aligned contact 192. The method of forming the conductive layer includes sequentially forming conductive material layers (not shown) covering the dielectric layer 130 and filling the self-aligned contact holes 140, 170 and the self-aligned shared contact hole 190 on the substrate 100. Then, the portion of conductive material layer covering the dielectric layer 130 is removed by a chemical mechanical polishing or an etch back process, thus finishing the fabrication of the self-aligned contacts 142, 172 and the self-aligned shared contact 192. The material of the conductive material layer is, for example, W, Cu, or an alloy thereof, or doped polysilicon. Usually, in addition to the above-mentioned materials, the conductive material layer further includes a barrier layer or an adhesion layer, which is made of, for example, titanium, tantalum, titanium nitride, tantalum nitride, or a combination thereof.

The Second Embodiment

FIGS. 3A-3H are sectional views of the processes of a method of fabricating another semiconductor device according to an embodiment of the present invention.

Figure 3A:
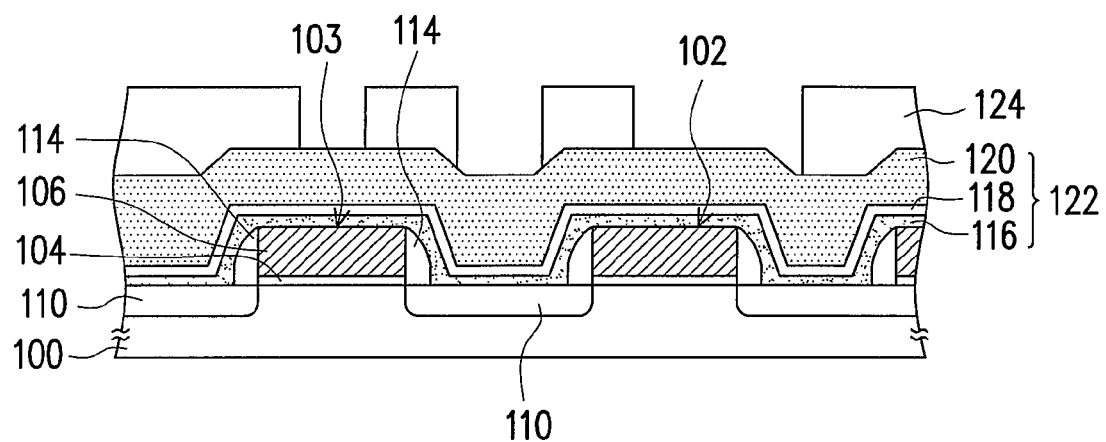
FIGS. 3A-3H are sectional views of the processes of a method of fabricating another semiconductor device according to another embodiment of the present invention.
Figure 3B:
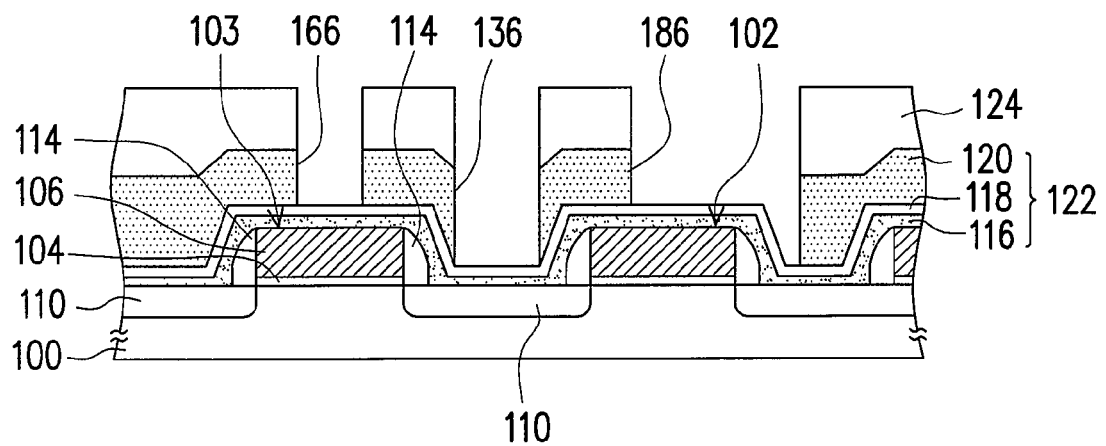

Referring to FIGS. 3A and 3B, a first stage of patterning process is performed on the dielectric layer 122 on the substrate 100 according to the method of the first embodiment, so as to form a lower hole 136 corresponding to the source/drain region 110, a lower hole 166 corresponding to the gate 106 of the transistor 103, and a lower hole 186 corresponding to the gate 106 of the transistor 102 and the source/drain region 110 of the transistor 103 in the dielectric layer 122.

Figure 3C:
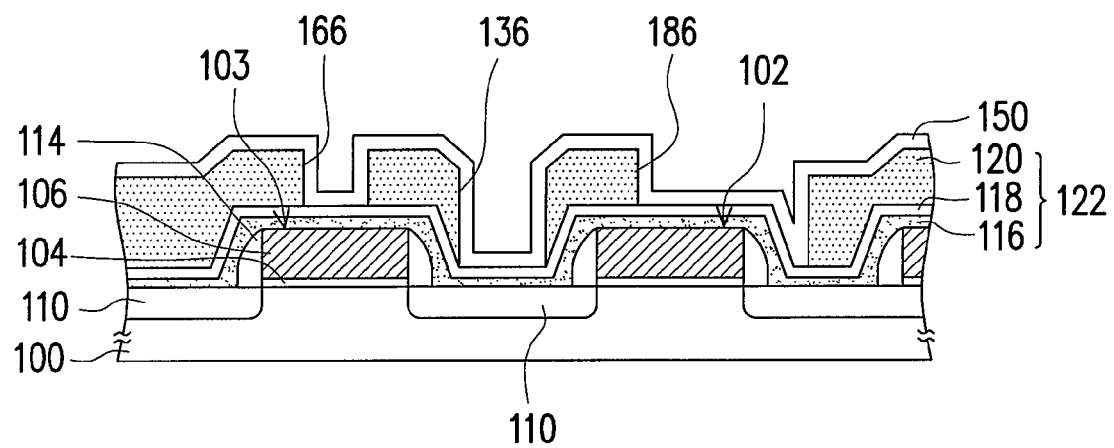

Referring to FIG. 3C, after removing the photoresist layer 124, a conformal liner layer material layer 150 is formed on the substrate 100 for covering the dielectric layer 122 and the sidewalls and bottoms of the lower holes 136, 166, and 186. The material of the liner layer material layer 150 includes silicon oxide or silicon oxynitride, and the method of forming the same is, for example, chemical vapor deposition.

Figure 3D:
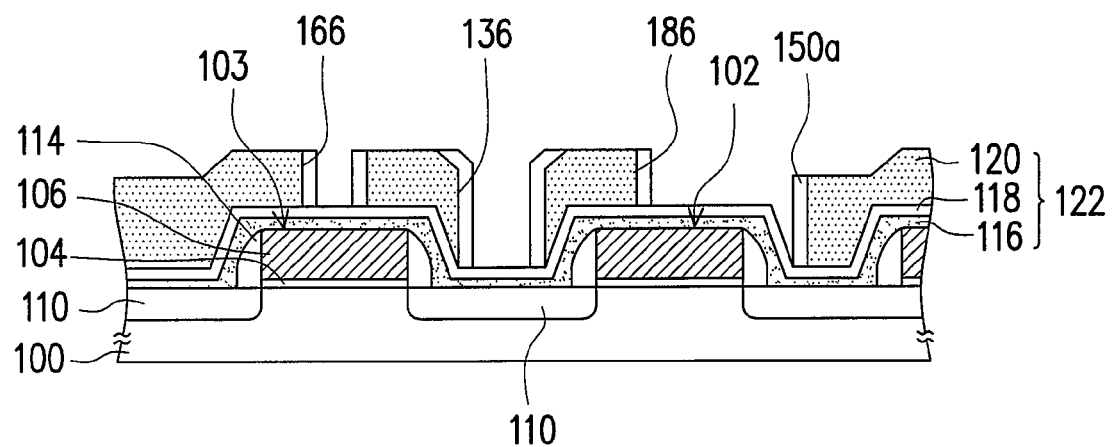
Figure 3E:
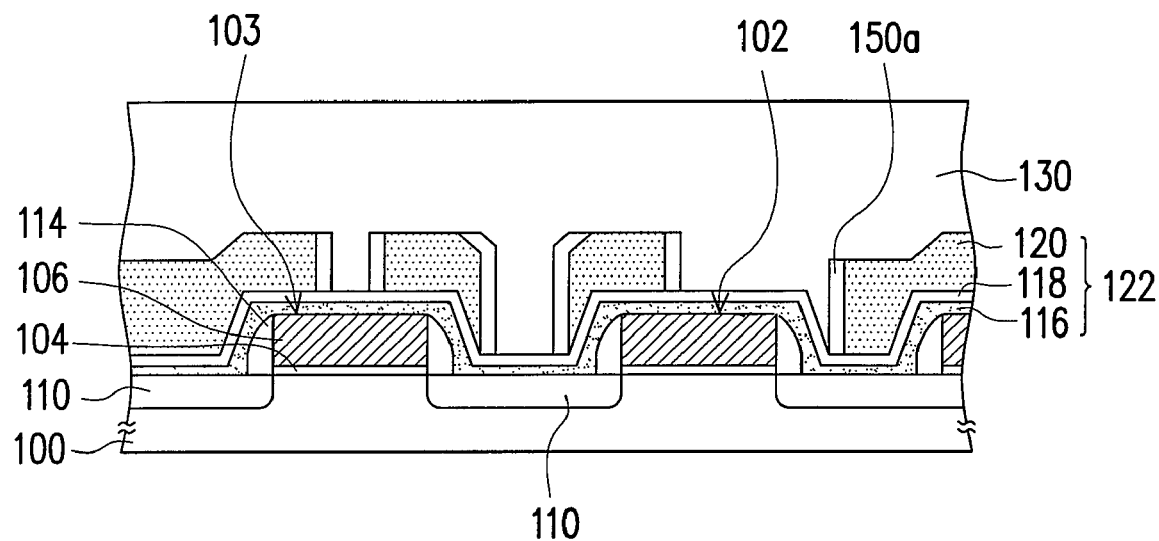
Figure 3F:
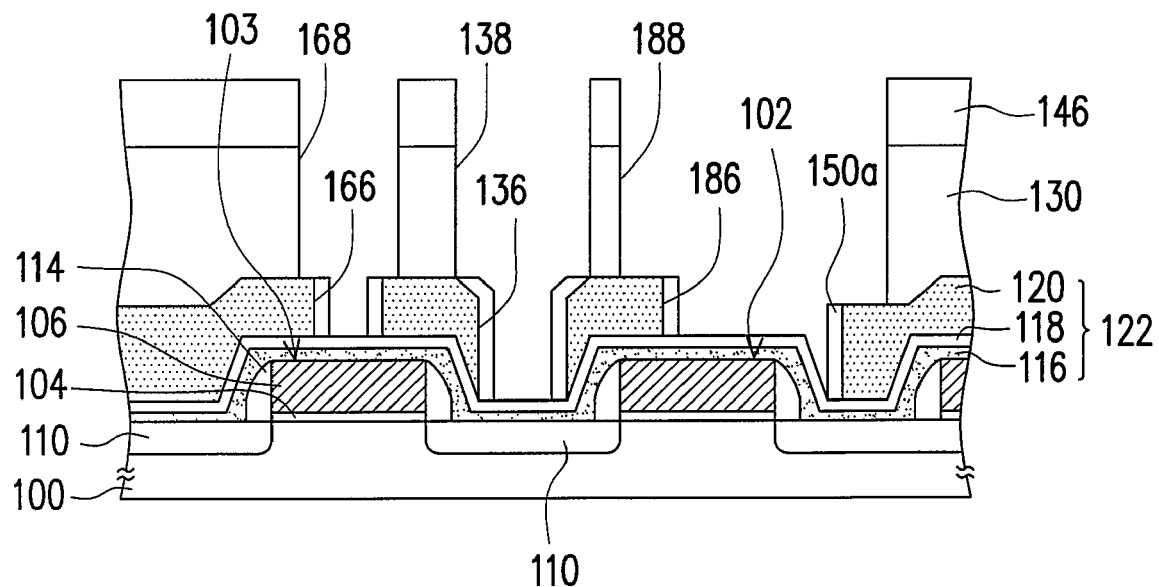
Figure 3G:
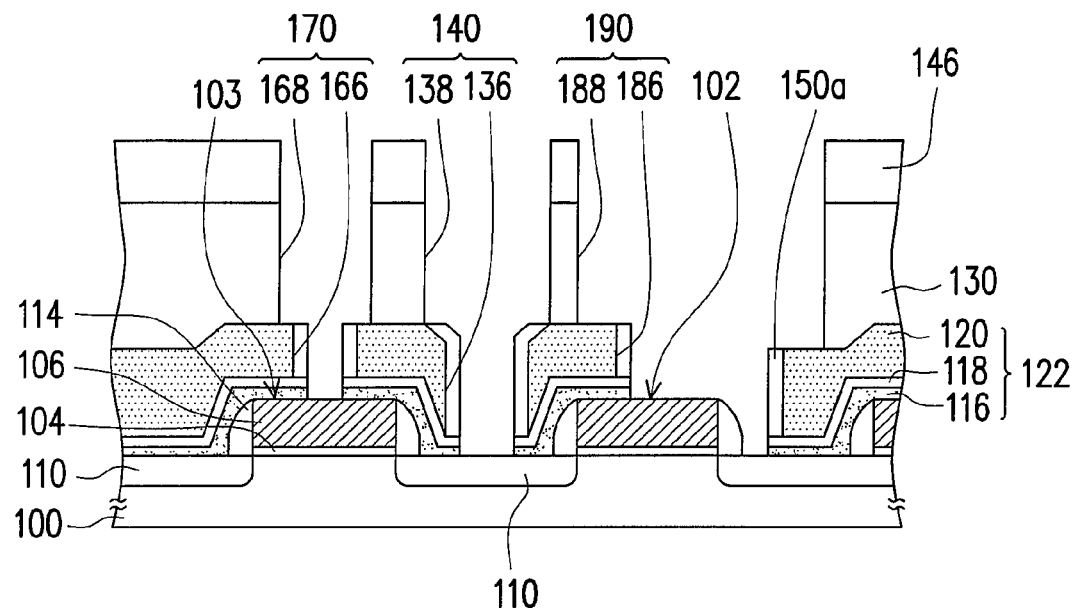
Figure 3H:
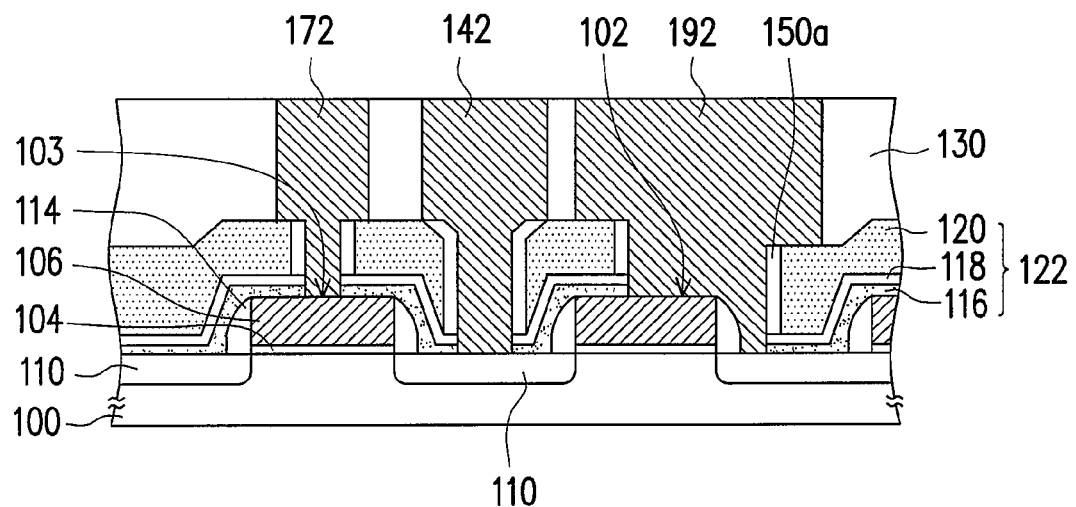

Referring to FIG. 3D, an anisotropic etching process is performed on the conformal liner layer material layer 150, and the portion of the conformal liner layer material layer 150 at the sidewalls of the lower holes 136, 166 and 186 is left to form a liner layer 150a. The liner layer 150a is used to reduce the size of the lower holes 136, 166, and 186. That is, the method of forming the lower holes 136, 166, and 186 can adopt the existing lithography process to perform exposing and developing, and after the etching process, the size of the lower holes 136, 166, and 186 is reduced by forming the liner layer 150a.

Referring to FIGS. 3E-3H, the dielectric layer 130 is formed according to the method of the first embodiment. Then, a second stage of patterning process is performed with the residual dielectric layer 122 as an etch stop layer, so as to form the upper holes 138, 168, and 188 in the dielectric layer 130. Thereafter, the dielectric layer 122 at the bottom of the lower holes 136, 166, 186 is removed to expose the source/drain region 110, the gate 106 of the transistor 103, and the gate 106 and the source/drain region 110 of the transistor 102, thus forming the self-aligned contact hole 140 constituted by the upper hole 138 and the lower hole 136, the self-aligned contact hole 170 constituted by the upper hole 168 and the lower hole 166, and the shared self-aligned contact hole 190 constituted by the upper hole 188 and the lower hole 186. Afterwards, the self-aligned contact holes 140, 170 and the shared self-aligned contact hole 190 are filled with the conductive layer, so as to form the self-aligned contacts 142, 172 and the shared self-aligned contact 192.

The self-aligned contact in an embodiment of the present invention is formed by a lower contact and an upper contact. The size of the upper contact is larger than the size of the lower contact. In another embodiment, a liner layer is further disposed between the periphery of the lower contact and the dielectric layer for reducing the size of the lower hole, such that the holes with smaller size can be fabricated with the existing lithography level.

In view of the above, the self-aligned contact process of the present invention performs etching in two stages or more multiple stages, which can improve the aligned accuracy window between the contact and a gate, and eliminate the short circuit caused by misalignment and long time over-etching.

Furthermore, the present invention adopts the multi-staged etching, the aspect ratio in each stage of contact hole is reduced, thus reducing the difficulty in etching, avoiding that the contact hole cannot be fully opened, and improving the process throughput.

Additionally, as the size of the upper hole is larger than the size of the lower hole of the contact, the conductive layer can be easily filled in the contact hole.

Moreover, a linear layer is formed in the lower hole, such that a smaller hole can be fabricated with the current lithography level.

In the other aspect, the widely used stress layer can be used in the present invention. The stress layer can be used as the first dielectric layer of the self-aligned lower hole, and can also be used as the etch stop layer in the subsequent etching process of the upper hole.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a two-step self-aligned contact, comprising:
providing a substrate having a contact region thereon;
forming a first dielectric layer on the substrate, wherein the first dielectric layer comprises an etch stop layer, an endpoint detection layer, and a stress layer, which are stacked from bottom to top, and cover from the contact region of the substrate to other region of the substrate;
forming a lower hole corresponding to the contact region in the first dielectric layer to expose the endpoint detection layer at a bottom of the lower hole;
after forming the lower hole, forming a second dielectric layer to directly contact the stress layer, wherein the lower hole is filled with the second dielectric layer to directly contact endpoint detection layer or the stress layer at the bottom of the lower hole;

forming an upper hole self-aligned to and communicated with the lower hole in the second dielectric layer and removing the etch stop layer and the endpoint detection layer at the bottom of the lower hole to expose the contact region, wherein the upper hole and the lower hole constitute a self-aligned contact hole; and filling the self-aligned contact hole with a conductive layer.

2. The method of fabricating a two-step self-aligned contact as claimed in claim 1, wherein the material of the stress layer comprises silicon nitride.

3. The method of fabricating a two-step self-aligned contact as claimed in claim 1, wherein in the step of forming the lower hole in the first dielectric layer, the stress layer is timed-etched.

4. The method of fabricating a two-step self-aligned contact as claimed in claim 1, wherein the material of the etch stop layer comprises silicon nitride, the material of the endpoint detection layer comprises silicon oxide, and the material of the stress layer comprises silicon nitride.

5. The method of fabricating a two-step self-aligned contact as claimed in claim 1, wherein the material of the endpoint detection layer comprises silicon oxide, and the material of the stress layer comprises silicon nitride.

6. The method of fabricating a two-step self-aligned contact as claimed in claim 1, wherein the material of the second dielectric layer is selected from a group consisting of silicon oxide deposited by atmospheric pressure chemical vapor deposition (CVD), silicon oxide deposited by high density plasma vapor deposition, phosphosilicate glass, borophosphosilicate glass, fluorine-doped silican glass, and a combination thereof.

7. The method of fabricating a two-step self-aligned contact as claimed in claim 1, wherein the self-aligned contact is a contact of a source/drain region, a contact of a gate, or a contact shared by a source/drain region and a gate.

8. The method of fabricating a two-step self-aligned contact as claimed in claim 1, wherein size of the lower hole is different from the size of the upper hole.

9. The method of fabricating a two-step self-aligned contact as claimed in claim 8, wherein the size of the lower hole is smaller than the size of the upper hole.

10. The method of fabricating a two-step self-aligned contact as claimed in claim 1, wherein a material of the stress layer is different that of the endpoint detection layer and a material of the endpoint detection layer is different that of the etch stop layer.

11. The method of fabricating a two-step self-aligned contact as claimed in claim 1, wherein the contact region is a doped region.

12. The method of fabricating a two-step self-aligned contact as claimed in claim 1, wherein the contact region is a gate.

13. The method of fabricating a two-step self-aligned contact as claimed in claim 1, wherein all of the etch stop layer, the endpoint detection layer and the stress layer cover from a gate of a transistor on the substrate to a doped region of the transistor.

14. The method of fabricating a two-step self-aligned contact as claimed in claim 1, wherein the step of forming the lower hole and the step of forming the second dielectric layer are performed continuously.

15. The method of fabricating a two-step self-aligned contact as claimed in claim 1, wherein each of the etch stop layer, the endpoint detection layer and the stress layer covers from the contact region to other contact region.

* * * * *